United States Patent
Takai et al.

(10) Patent No.: US 11,381,177 B2
(45) Date of Patent: Jul. 5, 2022

(54) VIBRATION WAVE MOTOR AND DRIVE DEVICE

(71) Applicant: CANON KABUSHIKI KAISHA, Tokyo (JP)

(72) Inventors: Kenta Takai, Yokohama (JP); Ryo Yamasaki, Tokyo (JP); Makoto Oikawa, Yokohama (JP); Kazuharu Osawa, Kawasaki (JP); Shunsuke Ninomiya, Yokohama (JP); Ryo Abe, Funabashi (JP)

(73) Assignee: Canon Kabushiki Kaisha, Tokyo (JP)

( * ) Notice: Subject to any disclaimer, the term of this patent is extended or adjusted under 35 U.S.C. 154(b) by 626 days.

(21) Appl. No.: 16/418,514

(22) Filed: May 21, 2019

(65) Prior Publication Data

US 2019/0363647 A1 Nov. 28, 2019

(30) Foreign Application Priority Data

May 24, 2018 (JP) .............................. JP2018-099447

(51) Int. Cl.
*H02N 2/04* (2006.01)
*H02N 2/00* (2006.01)
*H01L 41/09* (2006.01)

(52) U.S. Cl.
CPC ......... *H02N 2/043* (2013.01); *H01L 41/0913* (2013.01); *H02N 2/004* (2013.01)

(58) Field of Classification Search
CPC ...... H02N 2/043; H02N 2/004; H02N 2/0055; H02N 2/026; H02N 2/04; H01L 41/0913
See application file for complete search history.

(56) References Cited

U.S. PATENT DOCUMENTS

| 9,091,805 B2 | 7/2015 | Yamasaki et al. |
| 9,143,058 B2 | 9/2015 | Oikawa et al. |

(Continued)

FOREIGN PATENT DOCUMENTS

| JP | 2015-080329 A | 4/2015 |
| JP | 2015-220911 A | 12/2015 |

(Continued)

OTHER PUBLICATIONS

U.S. Appl. No. 16/394,398, Shunsuke Ninomiya, Ryo Yamasaki, Makoto Oikawa, Kazuharu Osawa, Ryo Abe, Kenta Takai, filed Apr. 25, 2019.

(Continued)

*Primary Examiner* — Emily P Pham
(74) *Attorney, Agent, or Firm* — Venable LLP

(57) ABSTRACT

Provided is a vibration wave motor, including: a vibrator including a piezoelectric element and a vibrating plate; a friction member, which includes a friction-contact surface to be brought into contact with the vibrator, and is configured to perform relative movement with respect to the vibrator by vibration generated by the vibrator; and a guide mechanism, which includes a first guide member, a second guide member, and a rolling member arranged between the first guide member and the second guide member, and is configured to guide the relative movement, wherein the first guide member includes a groove portion formed of a first surface and a second surface to be brought into contact with the rolling member, and wherein the first surface is longer than the second surface in a direction of the relative movement.

13 Claims, 7 Drawing Sheets

(56) References Cited

U.S. PATENT DOCUMENTS

| | | | |
|---|---|---|---|
| 9,158,083 B2 | 10/2015 | Oikawa et al. | |
| 9,507,119 B2 | 11/2016 | Araki | |
| 9,641,104 B2 | 5/2017 | Yamasaki et al. | |
| 10,069,440 B2 | 9/2018 | Osawa et al. | |
| 10,103,650 B2 | 10/2018 | Ninomiya | |
| 10,120,158 B2 * | 11/2018 | Oda ...................... | H02N 2/026 |
| 10,171,008 B2 | 1/2019 | Nishitani et al. | |
| 10,247,902 B2 | 4/2019 | Noguchi | |
| 10,840,828 B2 | 11/2020 | Shiono | |
| 2017/0371125 A1 | 12/2017 | Ninomiya | |
| 2018/0097459 A1 | 4/2018 | Osawa | |
| 2019/0181777 A1 | 6/2019 | Nakabayashi et al. | |

FOREIGN PATENT DOCUMENTS

| | | | |
|---|---|---|---|
| JP | 2017-198925 A | 11/2017 |
| JP | 2017-200361 A | 11/2017 |
| JP | 2017-200366 A | 11/2017 |

OTHER PUBLICATIONS

U.S. Appl. No. 16/440,388, Makoto Oikawa, Ryo Yamasaki, Kazuharu Osawa, Shunsuke Ninomiya, Ryo Abe, Kenta Takai, filed Jun. 13, 2019.

Office Action dated Mar. 15, 2022, in Japanese Patent Application No. 2018-099447.

\* cited by examiner

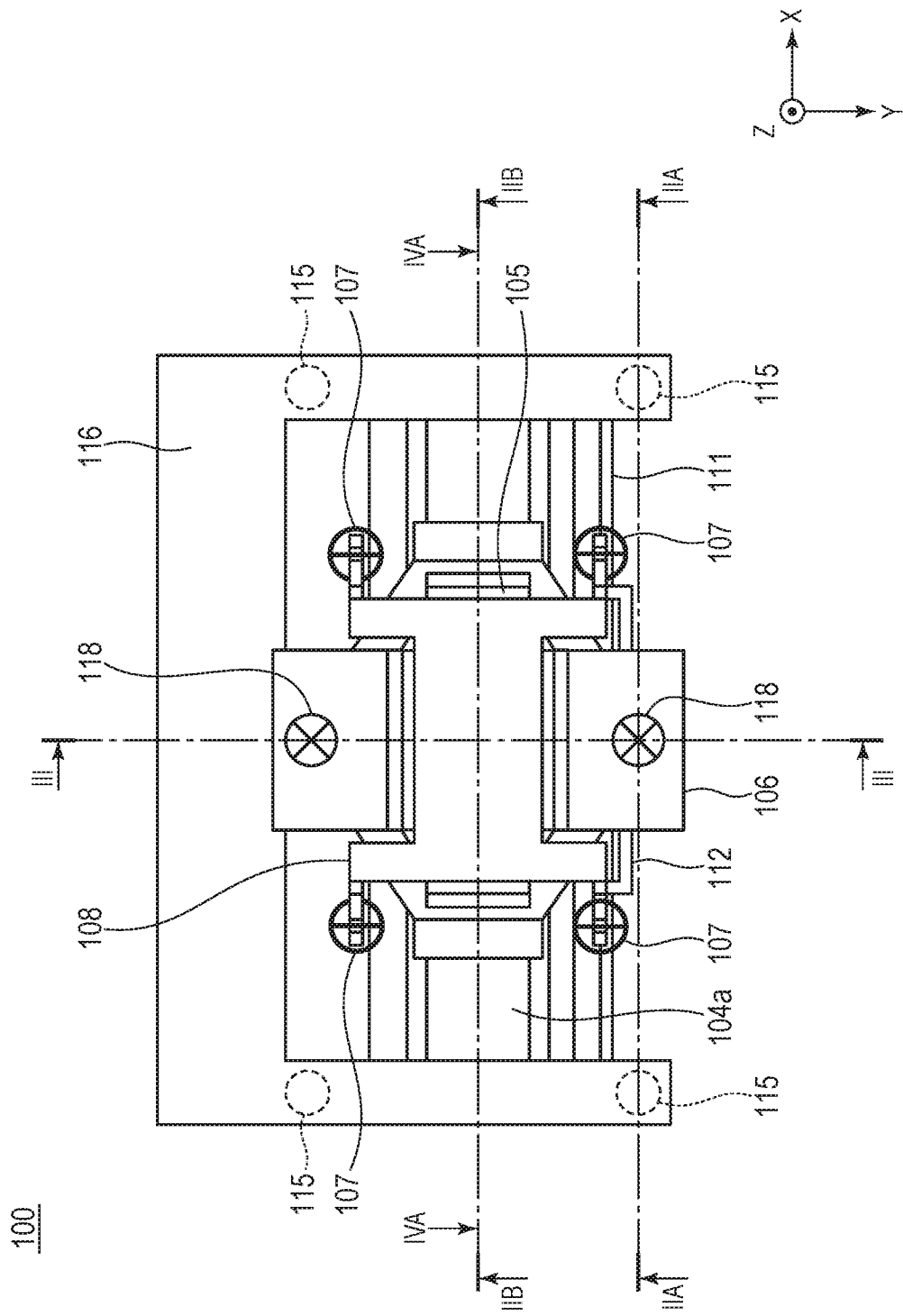

VIBRATION WAVE MOTOR AND DRIVE DEVICE

BACKGROUND OF THE INVENTION

Field of the Invention

This disclosure relates to a vibration wave motor and a drive device.

Description of the Related Art

A vibration wave motor of a linear motion type has high driving efficiency, and various measures for downsizing while maintaining high output have been considered. For example, an ultrasonic motor of a linear motion type disclosed in Japanese Patent Application Laid-Open No. 2015-220911 includes a vibrator, a friction member, a vibrator holding member, rolling balls, and a press unit. The vibrator holding member is configured to hold and move the vibrator. The rolling balls are configured to guide movement of the vibrator holding member. The press unit is configured to pressurize the vibrator against the friction member.

However, in the ultrasonic motor of a linear motion type disclosed in Japanese Patent Application Laid-Open No. 2015-220911, individual components are arranged so as to be placed on one another in a pressurizing direction in which the vibrator is pressurized. Accordingly, to achieve reduction in thickness, reduction in thickness of each individual component is conceivable. Meanwhile, when rigidity of each individual component is lowered by the reduction in thickness of each individual component, the components are excited by vibration of the vibrator, with the result that a squeal or a noise is generated. Consequently, there is a limit for the reduction in thickness in the pressurizing direction.

SUMMARY OF THE INVENTION

The present disclosure has an object to provide a vibration wave motor which is reduced in thickness and is compact.

According to one embodiment, there is provided a vibration wave motor, including: a vibrator including a piezoelectric element and a vibrating plate; a friction member, which includes a friction-contact surface to be brought into contact with the vibrator, and is configured to perform relative movement with respect to the vibrator by vibration generated by the vibrator; and a guide mechanism, which includes a first guide member, a second guide member, and a rolling member arranged between the first guide member and the second guide member, and is configured to guide the relative movement, wherein the first guide member includes a groove portion formed of a first surface and a second surface to be brought into contact with the rolling member, and wherein the first surface is longer than the second surface in a direction of the relative movement.

According to the present disclosure, a vibration wave motor which is reduced in thickness and is compact can be provided.

Further features of the present disclosure will become apparent from the following description of exemplary embodiments with reference to the attached drawings.

BRIEF DESCRIPTION OF THE DRAWINGS

FIG. 1 is a plan view of a vibration wave motor (100).

DESCRIPTION OF THE EMBODIMENTS

Figure 2A:
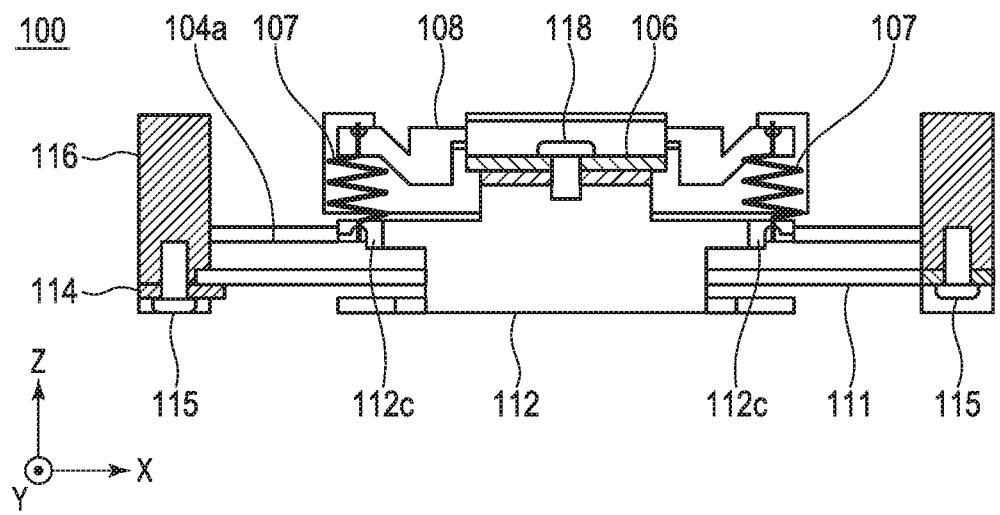
FIG. 2A and FIG. 2B are sectional views of the vibration wave motor (100).

Embodiment will now be described in detail in accordance with the accompanying drawings.

Embodiment

In the drawings, the same reference symbols represent the same members. In the specification, a relative movement direction in which a vibrator 101 and a friction member 104, which are described later, move relative to each other is referred to as "X-axis direction", and a pressurizing direction in which the vibrator 101 is pressurized against the friction member 104 is referred to as "Z-axis direction". In the Z-axis direction, a direction from the vibrator 101 toward the friction member 104 is defined as "minus Z-axis direction", and a direction from the friction member 104 toward the vibrator 101 is defined as "plus Z-axis direction". Moreover, a direction that is orthogonal to the X-axis direction and to the Z-axis direction is referred to as "Y-axis direction". Note that, in the following description, an example is described in which a vibration wave motor (ultrasonic motor) of a linear motion type in a unit is used as an actuator configured to drive a lens barrel 20 or the like of a digital camera described later. However, use thereof is not limited thereto.

Figure 2B:
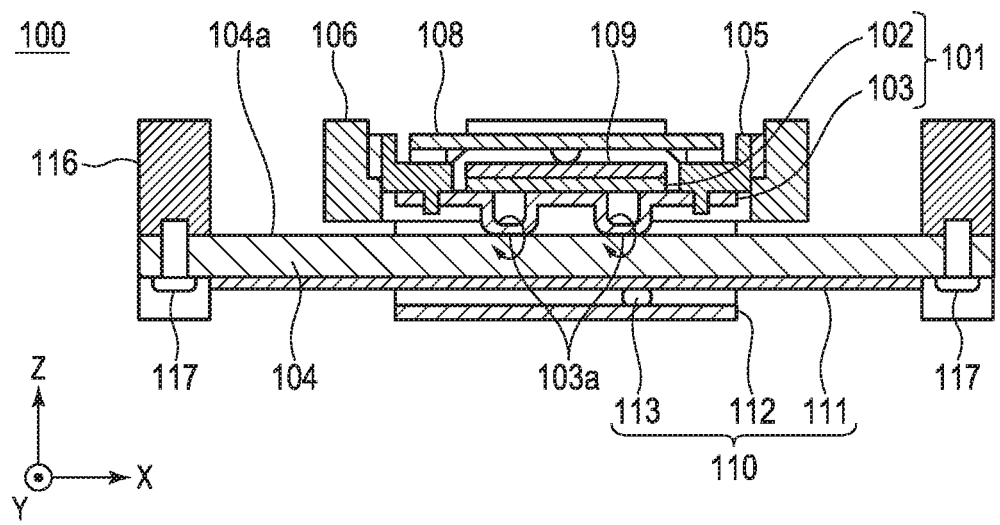
Figure 3:
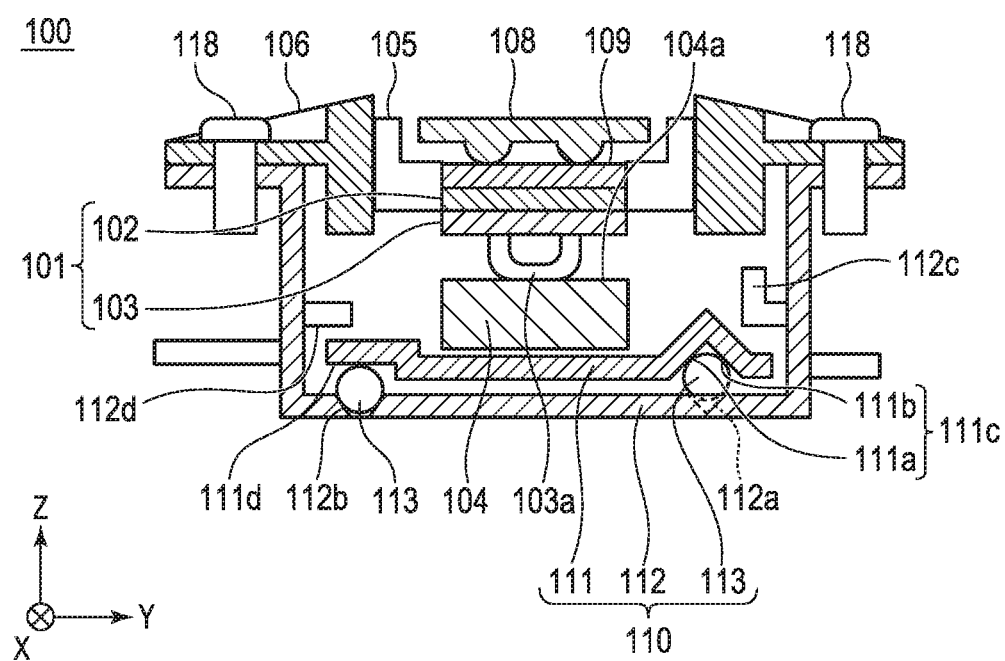
FIG. 3 is a sectional view of a movable portion of the vibration wave motor (100).

FIG. 1 is a plan view of a vibration wave motor of a linear motion type (hereinafter, referred to as "vibration wave motor 100") according to an embodiment of the present disclosure. FIG. 2A is a sectional view of the vibration wave motor 100 taken along the line IIA-IIA of FIG. 1. FIG. 2B is a sectional view of the vibration wave motor 100 taken along the line IIB-IIB of FIG. 1. FIG. 3 is a sectional view of a movable portion of the vibration wave motor 100 taken along the line of FIG. 1. The vibration wave motor 100 in the present embodiment has a longitudinal axis in the X-axis direction, and includes members described below.

With reference to FIG. 1 to FIG. 6, the structure of the vibration wave motor 100 in the present embodiment is described. The vibrator 101 includes a piezoelectric element 102 and a vibrating plate 103. The piezoelectric element 102 is fixed to the vibrating plate 103 with a known adhesive or the like. However, a method of adhesion of the piezoelectric element 102 to the vibrating plate 103 is not limited as long as the adhesion is achieved. The vibrating plate 103 includes a friction-contact portion 103a on a surface opposite to a surface on which the piezoelectric element 102 is fixed, and the friction-contact portion 103a is in contact with a friction-contact surface 104a of a friction member 104 in a pressure contact state in which the friction-contact portion 103a pressurizes the friction-contact surface 104a. When a high frequency voltage is applied to the piezoelectric element 102, high frequency vibration (ultrasonic vibration) having a frequency in an ultrasonic region is excited.

The generation of the ultrasonic vibration in the piezoelectric element 102 causes a resonance phenomenon to occur in the vibrator 101 including the piezoelectric element 102 and the vibrating plate 103, and the friction-contact portion 103a of the vibrating plate 103 performs an elliptic motion. A desired motion can be obtained through a change in frequency or in phase of the high frequency voltage to be applied to the piezoelectric element 102 to suitably change a rotation direction or an ellipticity ratio of the elliptic motion.

A vibrator support member 105 holds the vibrator 101 by a known method so as not to impede the resonance phenomenon described above. In addition, a relative-movement drive member 106 holds the vibrator support member 105 by a known method such that the vibrator support member 105 can swing without bearing load in the Z-axis direction which is the pressurizing direction of the vibrator 101, without any backlash in the X-axis direction and the Y-axis direction.

A press unit includes four tension coil springs 107, a pressurizing-force transmitting member 108, and a vibrator-pressurizing member 109. The four tension coil springs 107 are engaged with the pressurizing-force transmitting member 108 and a second guide member 112 described later to apply a pressurizing force in the minus Z-axis direction to the pressurizing-force transmitting member 108. The vibrator-pressurizing member 109 is sandwiched between the pressurizing-force transmitting member 108 and the vibrator 101 to transmit the pressurizing force from the pressurizing-force transmitting member 108 to the vibrator 101.

Figure 6:
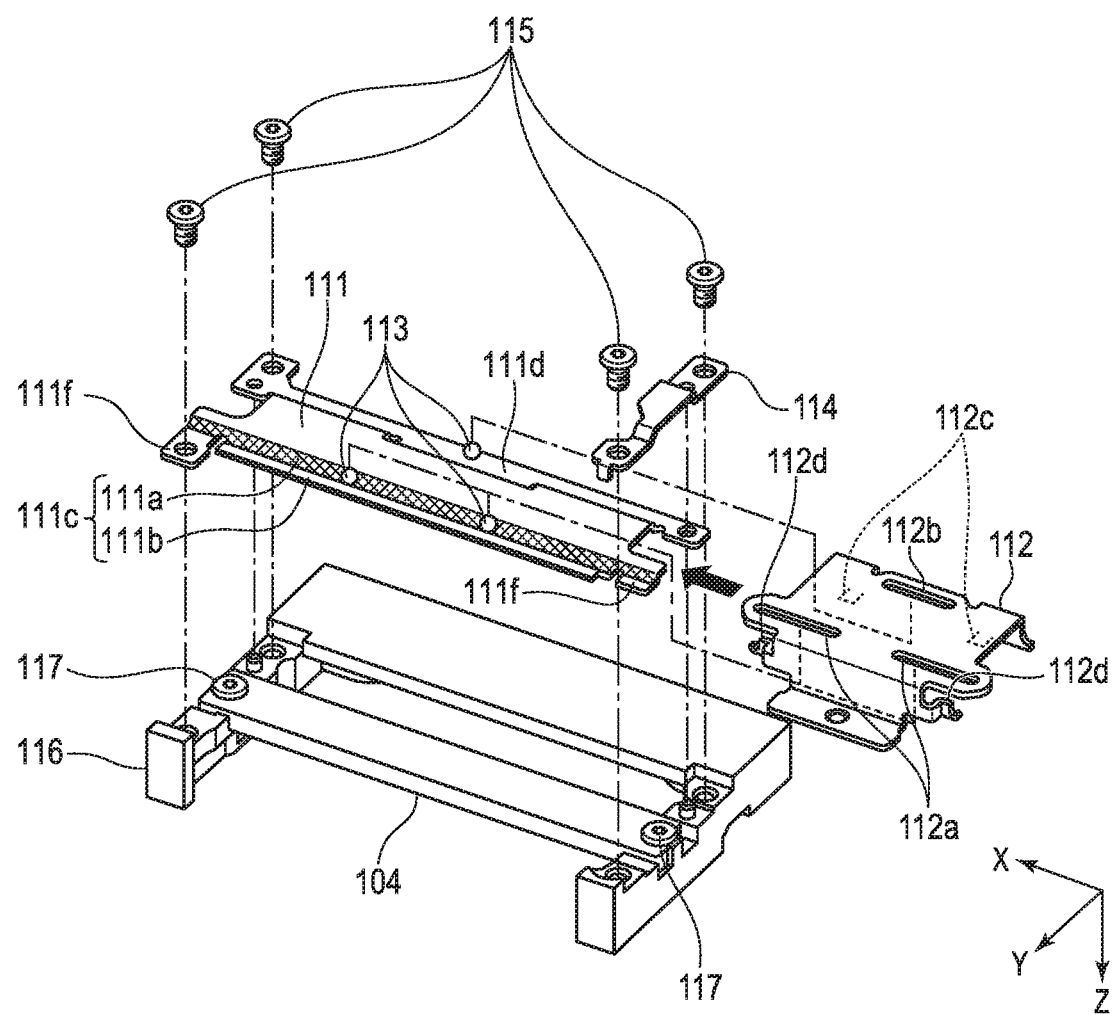
FIG. 6 is an exploded perspective view for illustrating a method of assembling a guide mechanism (110).

A guide mechanism 110 includes a first guide member 111, the second guide member 112, and a plurality of rolling members 113, and is configured to guide relative movement between the vibrator 101 and the friction member 104 in the X-axis direction. The plurality of rolling members 113 are sandwiched between the first guide member 111 and the second guide member 112. The first guide member 111 includes both end portions 111e in the X-axis direction of the first guide member 111, which are fixed to the holding member 116 with a retaining member 114 and screws 115 as illustrated in FIG. 6. Further, both end portions of the friction member 104 in the X-axis direction are fixed to and held by the holding member 116 with screws 117. As illustrated in FIG. 3, the second guide member 112 is fixed to the relative-movement drive member 106 with a screw 118, and receives a driving force of the vibrator 101 to relatively move in the X-axis direction. Although the first guide member 111, the second guide member 112, and the friction member 104 are each fixed with the screws in the present embodiment, a method of fixing is not limited as long as the members are fixed.

With reference to FIG. 3, the first guide member 111 includes a groove portion 111c, which is continuous in the X-axis direction which is the direction of the relative movement, having a V-shaped cross section by a V-bending structure. In FIG. 4B and FIG. 6, one surface 111a (first surface) forming the groove portion 111c is illustrated by cross hatching. In addition, the second guide member 112 includes groove portions 112a and 112b. The groove portion 112a faces the groove portion 111c of the first guide member 111, and the two rolling members 113 are sandwiched between the groove portion 111c and the groove portion 112a. Further, the groove portion 112b faces a flat surface portion 111d of the first guide member 111, and one rolling member 113 is sandwiched between the groove portion 112b and the flat surface portion 111d. The relative movement between the vibrator 101 and the friction member 104 is guided linearly in the X-axis direction by rolling of the rolling members 113.

Next, a stopper function of the second guide member 112 is described. The second guide member 112 includes stoppers 112c and 112d to function as stoppers. When vibration or an impact is applied to the vibration wave motor 100 from an outside, and the first guide member 111 and the second guide member 112 are separated away from each other in the Z-axis direction, the stoppers 112c and 112d are brought into contact with the first guide member 111. Accordingly, a distance between the first guide member 111 and the second guide member 112 in the Z-axis direction can be regulated. With this structure, the rolling members 113 sandwiched between the first guide member 111 and the second guide member 112 can be prevented from falling off from the groove portions 112a and 112b.

The members described above are assembled into a unit as the vibration wave motor 100. The vibrator 101, the vibrator support member 105, the relative-movement drive member 106, the press unit, and the second guide member 112 are integrally movable, and form a movable portion in the vibration wave motor 100.

Next, positions of the movable portion and the groove portion 111c in the X-axis direction in the vibration wave motor 100 are described. FIG. 4A is a sectional view of the vibration wave motor 100 taken along the cross-sectional line IVA-IVA of FIG. 1, when viewed from an opposite side of the sectional view of FIG. 2B. FIG. 4A, which is different from the state of FIG. 2B, is the view for illustrating a state in which the movable portion is moved in the plus X-axis direction, and the relative-movement drive member 106 is in contact with the holding member 116, that is, the movable portion is positioned at a movable end which is a limit of a movable range in the plus X-axis direction. At this time, the two rolling members 113 roll between the groove portion 111c and the groove portion 112a to a predetermined position in the plus X-axis direction. Similarly, when the movable portion is moved in the minus X-axis direction and is positioned at a movable end in the minus X-axis direction, the two rolling members 113 roll between the groove portion 111c and the groove portion 112a to a predetermined position (position at a broken line in the drawing) in the minus X-axis direction. A rolling range 119 between the movable ends of the two rolling members 113 is indicated by an arrow.

Figure 4C:
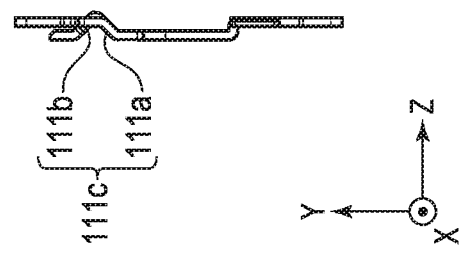
FIG. 4C is a side view of the first guide member (111).
Figure 4A:
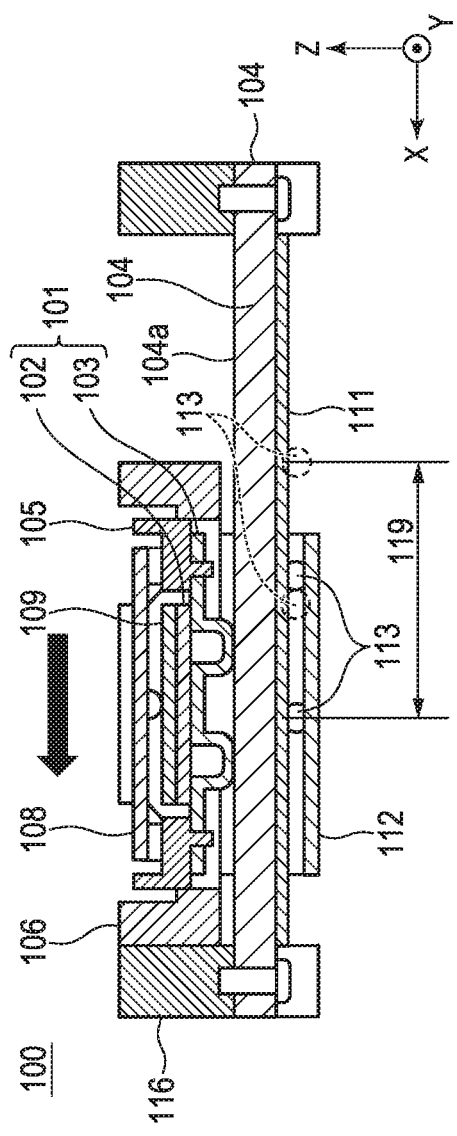
FIG. 4A is a sectional view of the vibration wave motor (100).
Figure 4B:
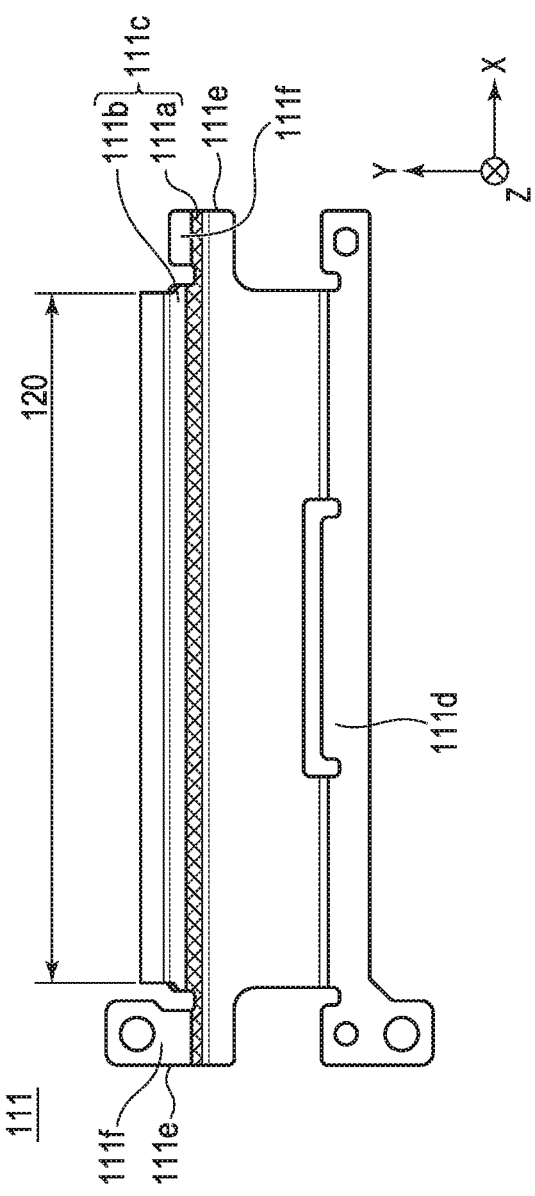
FIG. 4B is a bottom view of a first guide member (111).

FIG. 4B is a bottom view of the first guide member 111, and FIG. 4C is a side view of the first guide member 111. The groove portion 111c by the continuous V-bending structure includes two surfaces, that is, the one surface 111a closer to the vibrator 101 and another surface 111b (second surface) farther from the vibrator 101 in the Y-axis direction. The groove portion 111c is formed continuous to an outside beyond the rolling range 119 of the rolling members 113 in the X-axis direction. An installation range 120 of the groove portion 111c is indicated in FIG. 4B. Further, the one surface 111a of the groove portion 111c is formed continuous to the end portions 111e of the first guide member 111 in the X-axis direction. Still further, the first guide member 111 includes a mounting surface 111f, and the one surface 111a of the groove portion 111c extends to the mounting surface 111f. That is, in the X-axis direction, the one surface 111a is longer than another surface 111b. Through extension of the one surface 111a of the groove portion 111c as described above, an advantage can be obtained in which rigidity of the first guide member 111 is increased.

Figure 5:
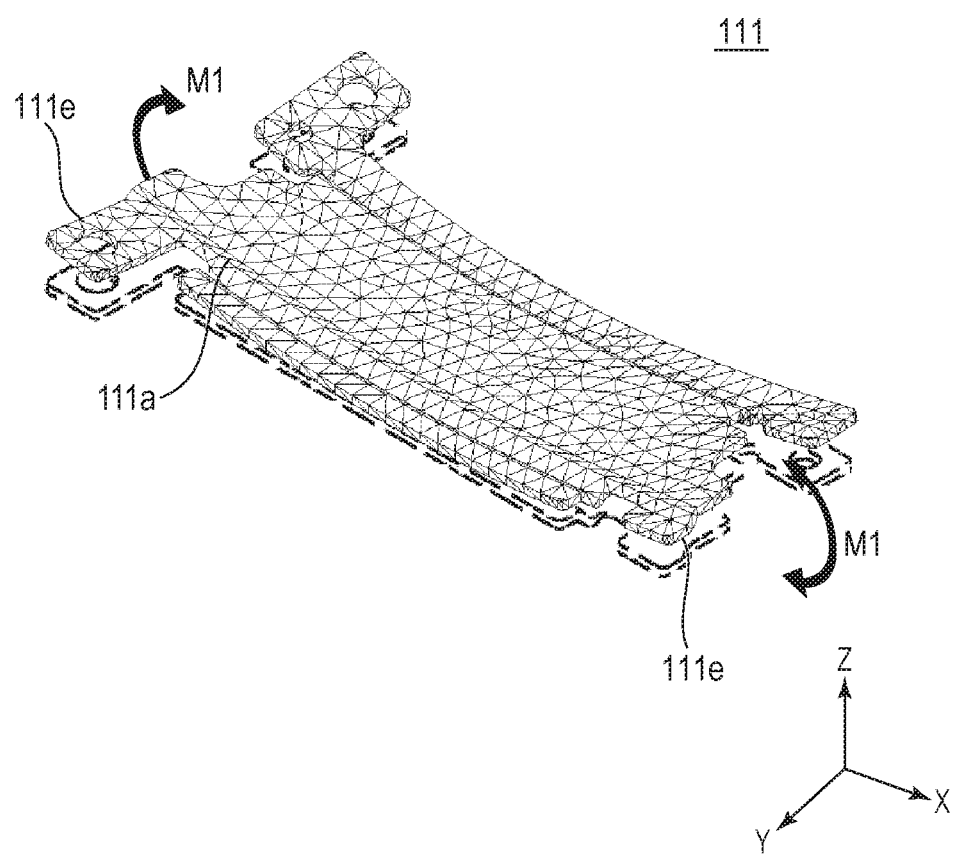
FIG. 5 is a perspective view for illustrating resonance of the first guide member (111).

Next, with reference to FIG. 5, the resonance of the first guide member 111 is described. FIG. 5 is a perspective view for illustrating bending vibration M1 of the first guide member 111. The friction member 104 is adjacent to the first guide member 111 in vicinities of both end portions thereof via the holding member 116. For that reason, there is a fear in that ultrasonic vibration of the vibrator 101 may be transmitted to the holding member 116 and the first guide member 111 via the friction member 104, and resonance is induced in the first guide member 111. As vibration most likely to be generated in a plate-shaped member such as the first guide member 111, there is bending vibration M1 with which the end portions 111e of the first guide member 111 in the X-axis direction particularly vibrates largely.

As illustrated in FIG. 6, the first guide member 111 includes the mounting surface 111f which is separated away from the positions to be in contact with the rolling members 113 in the X-axis direction and is positioned in a vicinity of the one surface 111a of the groove portion 111c. The mounting surface 111f can be fixed to the holding member 116 with the screws 115, with the result that large vibration can be suppressed at both the end portions 111e of the first guide member 111 in the X-axis direction. With this structure, the noise or the squeal due to excitation is less liable to occur. The mounting surface 111f is adjacent to another surface 111b in the X-axis direction.

Further, if the rigidity of the first guide member 111 is low, the squeal or the noise due to excitation is liable to occur. To increase the rigidity, it is conceivable to increase thickness of the first guide member 111 in the Z-axis direction. However, in that case, the entire unit of the vibration wave motor 100 is also increased in thickness. Meanwhile, the first guide member 111 includes the groove portion 111c in a V-bending structure, and further, the one surface 111a of the groove portion 111c extends to both the end portions 111e in the X-axis direction. Thus, higher bending rigidity of the first guide member 111 is obtained. For this reason, the noise or the squeal due to excitation is less liable to occur. That is, the first guide member 111 can be increased in rigidity while the first guide member 111 is thin, without the first guide member 111 being increased in thickness.

Next, a method of assembling the first guide member 111 is described. FIG. 6 is an exploded perspective view for illustrating a method of assembling the first guide member 111 and the second guide member 112 to the holding member 116. The second guide member 112 includes the stoppers 112c and 112d, and it is difficult to assemble the second guide member 112 to the first guide member 111 from the Z-axis direction. Therefore, to assemble the second guide member 112, it is required to first insert the second guide member 112 into the first guide member 111 in the X-axis direction and to fix the first guide member 111 to the holding member 116. Here, the groove portion 111c of the first guide member 111 is a groove continuous in the X-axis direction so that the second guide member 112 can be inserted from a side while the rolling members 113 are being slid in the X-axis direction. Further, the first guide member 111 does not have a fixing portion (mounting surface 111f) to the holding member 116 on a side on which the second guide member 112 is inserted. Therefore, the first guide member 111 is fixed to the holding member 116 with the screws 115 through intermediation of the retaining member 114. With the structure described above, the second guide member 112 can easily be assembled in the state in which the stoppers 112c and 112d are provided.

Application Example

Figure 7:
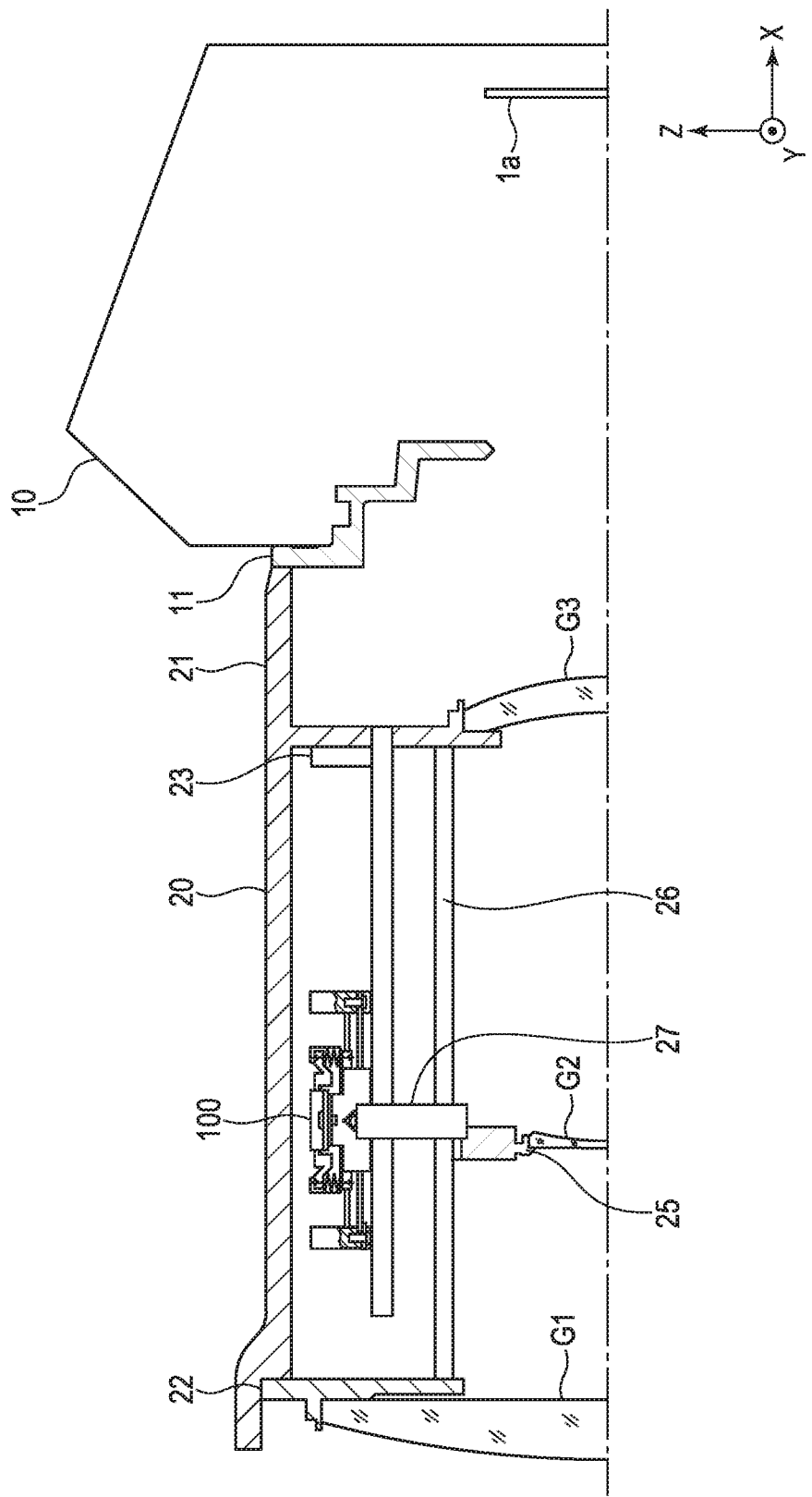
FIG. 7 is a sectional view of a lens barrel (20), in which the vibration wave motor (100) is mounted, and a camera body (10).

FIG. 7 is a view for illustrating a lens barrel 20 as an application example of a drive device in which the vibration wave motor 100 is assembled. The lens barrel 20 is substantially rotationally symmetrical, and only an upper half is illustrated. The lens barrel 20 is removably mounted to a camera body 10 as an image pickup device, and the camera body 10 includes an image pickup element 1a therein. A mount 11 of the camera body 10 includes a bayonet portion configured to mount the lens barrel 20 to the camera body 10. The lens barrel 20 includes a fixed barrel 21, and the fixed barrel 21 is in contact with a flange portion of the mount 11. The fixed barrel 21 and the mount 11 are fixed with screws (not shown). Further, a front barrel 22 configured to hold a lens G1 and a rear barrel 23 configured to hold a lens G3 are fixed to the fixed barrel 21. The lens barrel 20 further includes a focus lens holding frame 25 to hold a focus lens G2. Further, the focus lens holding frame 25 is held by a guide bar 26, which is held by the front barrel 22 and the rear barrel 23, to be linearly movable. A flange portion (not shown) is formed in the holding member 116 of the vibration wave motor 100, and is fixed to the rear barrel 23 with screws or the like. The focus lens holding frame 25 is coupled to the relative-movement drive member 106 by a coupling member 27 by a known method without backlash.

With the structure as described above, when the movable portion including the relative-movement drive member 106 of the vibration wave motor 100 is driven, a drive force of the vibration wave motor 100 is transmitted to the focus lens holding frame 25 via the relative-movement drive member 106 and the coupling member 27. The focus lens holding frame 25 is guided by the guide bar 26 to move linearly.

With the structure described above, it is possible to obtain the vibration wave motor 100 which is compact and has the guide mechanism 110 having a small thickness and a high rigidity. The present disclosure is not limited to the embodiment and the application example described above, and any form may be applied within the scope of claims. For example, the drive device including the vibration wave motor 100 is not limited to the lens barrel 20 including the focus lens holding frame 25 as a driven portion of the vibration wave motor 100. The image pickup element 1a of the image pickup device, a stage or the like of a stage device may be a driven portion.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-099447, filed May 24, 2018, which is hereby incorporated by reference herein in its entirety.

What is claimed is:

1. A vibration wave motor, comprising:
a vibrator including a piezoelectric element and a vibrating plate;
a friction member, which includes a friction-contact surface to be brought into contact with the vibrator, and is configured to perform relative movement with respect to the vibrator by vibration generated by the vibrator; and
a guide mechanism, which includes a first guide member, a second guide member, and a rolling member arranged between the first guide member and the second guide member, and is configured to guide the relative movement,
wherein the first guide member includes a groove portion formed of a first surface and a second surface to be brought into contact with the rolling member, and wherein the first surface is longer than the second surface in a direction of the relative movement.

2. The vibration wave motor according to claim 1, wherein the first surface is formed continuous to end portions of the first guide member in the direction of the relative movement.

3. The vibration wave motor according to claim 1, wherein the first guide member includes a mounting surface at a position separated away from a position to be brought into contact with the rolling member in the direction of the relative movement, and the first surface extends to the mounting surface in the direction of the relative movement.

4. The vibration wave motor according to claim 3, wherein the mounting surface is arranged at a position to be adjacent to the second surface in the direction of the relative movement.

5. The vibration wave motor according to claim 1, wherein the groove portion has a V-bending structure having a V-shaped cross section, and is configured to guide the relative movement linearly.

6. The vibration wave motor according to claim 1, further comprising a holding member configured to fix the first guide member;
wherein the first guide member has one end portion, which is fixed to the holding member through intermediation of a retaining member, in the direction of the relative movement with respect to the holding member.

7. The vibration wave motor according to claim 1,
wherein the vibration comprises high frequency vibration having a frequency in an ultrasonic wave range, and
wherein the vibration wave motor comprises an ultrasonic wave motor.

8. The vibration wave motor according to claim 1, further comprising a press unit configured to apply a force which brings the vibrator into pressure contact with the friction member.

9. The vibration wave motor according to claim 8, wherein the first surface is closer to the vibrator than the second surface in a direction orthogonal to a direction of the relative movement and of the force applied by the press unit.

10. A drive device, comprising:
a vibration wave motor including:
a vibrator including a piezoelectric element and a vibrating plate;
a friction member, which includes a friction-contact surface to be brought into contact with the vibrator, and is configured to perform relative movement with respect to the vibrator by vibration generated by the vibrator; and
a guide mechanism, which includes a first guide member, a second guide member, and a rolling member arranged between the first guide member and the second guide member, and is configured to guide the relative movement,
wherein the first guide member includes a groove portion formed of a first surface and a second surface to be brought into contact with the rolling member, and
wherein the first surface is longer than the second surface in a direction of the relative movement, and
a driven portion to which a driving force of the vibration wave motor is transmitted.

11. The drive device according to claim 10, wherein the driven portion comprises a lens holding frame.

12. The drive device according to claim 10, wherein the driven portion comprises an image pickup element.

13. The drive device according to claim 10, wherein the driven portion comprises a stage.

\* \* \* \* \*